United States Patent [19]

Firooz

[11] Patent Number: 5,590,136
[45] Date of Patent: Dec. 31, 1996

[54] METHOD FOR CREATING AN IN-CIRCUIT TEST FOR AN ELECTRONIC DEVICE

[75] Inventor: Kamran Firooz, Loveland, Colo.

[73] Assignee: Hewlett-Packard CO, Palo Alto, Calif.

[21] Appl. No.: 378,224

[22] Filed: Jan. 25, 1995

[51] Int. Cl.⁶ .................................................. G01R 31/28
[52] U.S. Cl. .............................................. 371/25.1; 371/27
[58] Field of Search ............................. 371/25.1, 22.5, 371/22.6, 27, 24, 22.4, 22.1

[56] References Cited

U.S. PATENT DOCUMENTS

| | | | |
|---|---|---|---|
| 3,916,306 | 10/1975 | Patti | 371/27 |
| 4,380,070 | 4/1983 | Steiner | 371/20 |
| 4,484,329 | 11/1984 | Slamka et al. | 371/25 |
| 4,500,993 | 2/1985 | Jacobson | 371/16 |
| 4,622,647 | 11/1986 | Sagnard et al. | 364/580 |
| 4,829,520 | 5/1989 | Toth | 371/15 |
| 5,004,978 | 4/1991 | Morris, Jr. et al. | 324/158 |
| 5,144,229 | 9/1992 | Johnsrud et al. | 324/158 |
| 5,323,108 | 6/1994 | Marker et al. | 324/158 |
| 5,398,252 | 3/1995 | Ohashi | 371/25.1 |
| 5,473,619 | 12/1995 | Sakaguchi | 371/25.1 |

*Primary Examiner*—Robert W. Beausoliel, Jr.
*Assistant Examiner*—Trinh L. Tu

[57] ABSTRACT

In an automated test equipment system for testing a circuit board containing a plurality of interconnected digital devices, an in-circuit test is created for a device under test based on stimuli used to test devices which drive the device under test. The method includes the steps of determining, from the electrical interconnect data for the devices on the circuit board, which devices have an output driving an input of the device under test; testing each of the driving devices; observing the response of the device under test during testing of the driving devices; and using the test stimuli for the driving devices and the observed response of the device under test as an in-circuit test for the device under test.

6 Claims, 4 Drawing Sheets

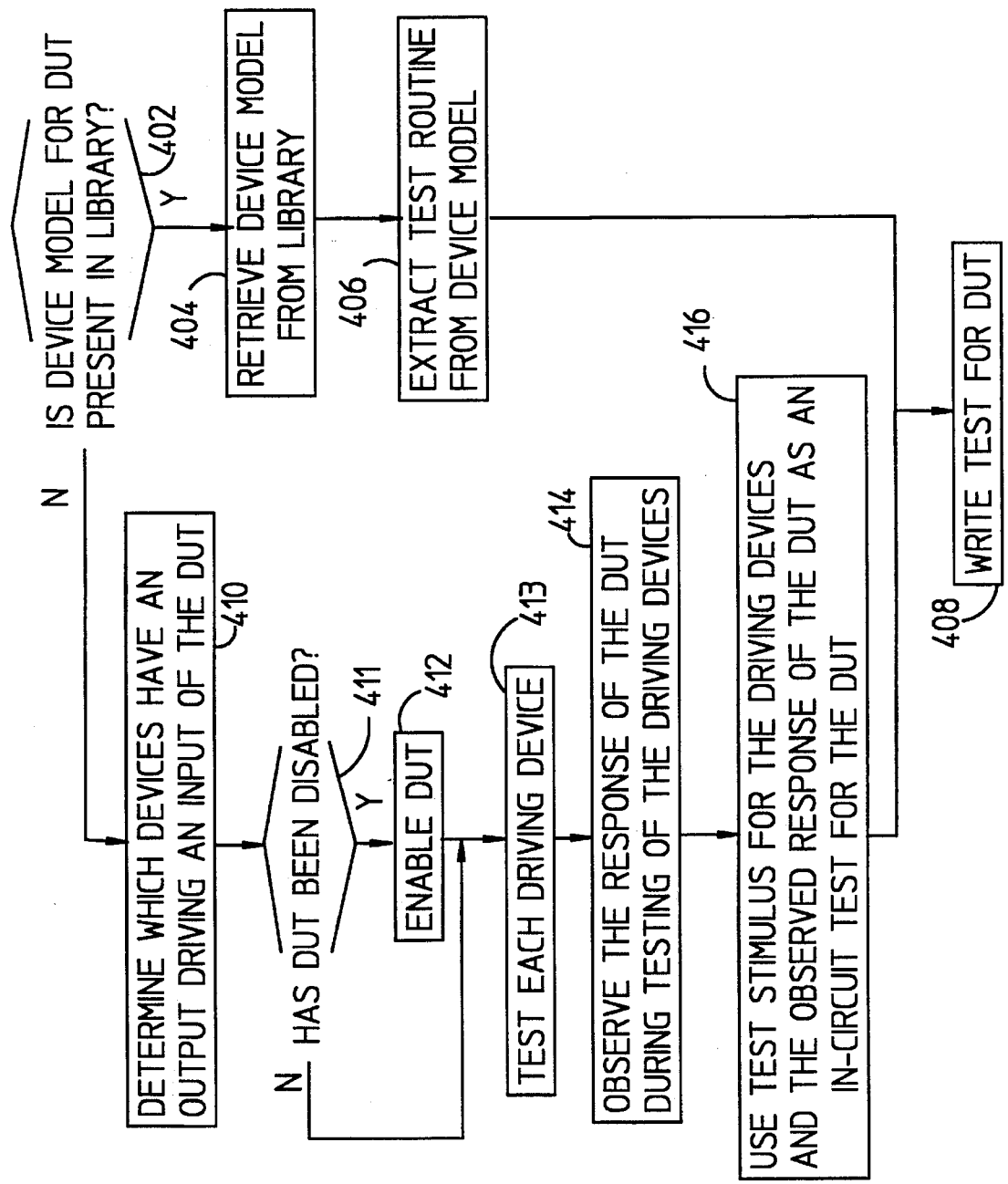

METHOD FOR CREATING AN IN-CIRCUIT TEST FOR AN ELECTRONIC DEVICE

BACKGROUND OF THE INVENTION

1. Field of the Invention

The present invention relates to the field of digital in-circuit testing. More specifically, the invention relates to a method for creating an in-circuit test for a device.

2. Related Art

In-circuit test is a test wherein the performance of each digital integrated circuit (IC) on a board is independently tested as a functional unit. In order to perform in-circuit test, a tester must apply input signals directly to the inputs of a DUT (device under test or to be tested) and must access the outputs of the DUT to observe the output response. A "bed-of-nails" (i.e., probes that directly make contact with the device I/O pins from pads on the surface of the board) fixture is used to provide access to the required nodes on the board. Each digital IC on the circuit board can then be tested as if it were electrically isolated from the circuit. In-circuit testing is described in detail in U.S. Pat. No. 5,004,978, entitled "Method for Regenerating In-Circuit Test Sequences for Circuit Board Components," the full text of which is incorporated herein by reference.

One requirement for in-circuit test is that complete stimulus and response patterns be known to the tester for each device to be tested. The stimulus and response patterns for a device are known as a "test routine." Each test routine is stored in a device model in a device models library. As a result, tests for many common digital IC's can be programmed once, in advance, stored in the library, and then called upon when needed. This greatly simplifies test generation since this pre-programmed test can be used over and over again.

In many instances, test information for a device will not be known. As a result, no test routine is available. If no test routine is available in the library, a test engineer has conventionally been faced with two choices. First, he or she could generate a test for the device. This is the preferred choice because once the test has been generated, it can be added to the library for future use. However, with a new device, the information required to generate a test (e.g., a manufacturer's specification sheet) may not be available.

The second choice available to the test engineer is to skip testing the device. While this results in the device not being tested in the in-circuit configuration, it is often the only choice available to the test engineer.

What is needed is a method for creating an in-circuit test for devices about which little information is available.

SUMMARY OF THE INVENTION

The invention is a method for creating an in-circuit test for a device under test (DUT) based on stimuli used to test devices which drive the DUT. The method includes the steps of receiving electrical interconnect data for the devices on the circuit board; determining from the electrical interconnect data which devices have an output driving an input of the DUT; testing each of the driving devices; observing the response of the DUT during testing of the driving devices; and using the test stimuli for the driving devices and the observed response of the DUT as an in-circuit test for the DUT. The test routine includes, as test inputs, the test stimulus applied to inputs of each driving device and, as test outputs, the previously observed response from the DUT.

The driving devices are tested by applying test stimulus to inputs of each driving device, observing outputs of the driving devices, and comparing the observed outputs to expected outputs. The in-circuit test for the DUT is used by applying test stimulus to inputs of each driving device, observing a new response of the DUT, and comparing the newly observed response of the DUT to the previously observed response of the DUT.

The test generated/created according to the method of the invention is far from exhaustive and complete. Nonetheless, the invention provides a great deal of confidence that if the new test is applied and the DUT passes, then the DUT is probably the correct component, properly inserted, and all of the tested pins are functioning properly.

The foregoing and other features and advantages of the invention will be apparent from the following, more particular description of a preferred embodiment of the invention, as illustrated in the accompanying drawings.

BRIEF DESCRIPTION OF THE FIGURES

FIG. 4 is a flowchart of the steps of a preferred embodiment of the invention for creating an in-circuit test for a device under test.

DETAILED DESCRIPTION OF THE PREFERRED EMBODIMENT

The preferred embodiment of the invention is discussed in detail below. While specific part numbers and/or configurations are discussed, it should be understood that this is done for illustration purposes only. A person skilled in the relevant art will recognize that other components and configurations may be used without parting from the spirit and scope of the invention.

The preferred embodiment of the invention is now described with reference to the figures where like reference numbers indicate like elements. Also in the figures, the left most digits of each reference number corresponds to the figure in which the reference number is first used.

Figure 1:
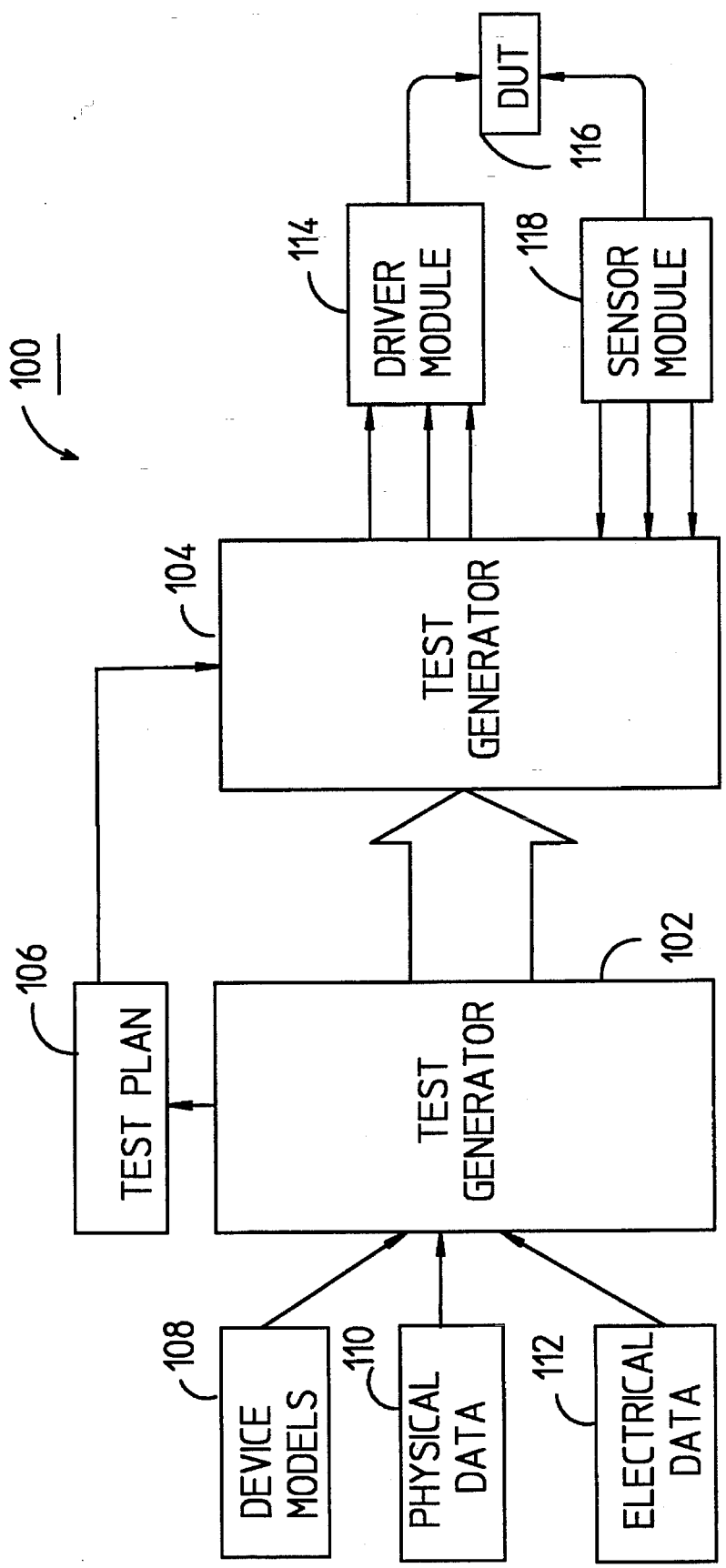
FIG. 1 is a block diagram of an automated test equipment (ATE) for testing printed circuit boards loaded with digital electronic circuitry.

In-circuit testing is conventionally performed on an ATE (Automated Test Equipment) system. An ATE system (tester) 100 is shown in FIG. 1. ATE system 100 includes a test generator 102 and a test controller 104. Test generator 102 generates an in-circuit test for each device on a board to be tested. A generic test plan 106 provides supervisory control over testing. This includes sequencing the tests, logging the results, controlling board/fixture interfacing, controlling the test power supplies, and providing a user interface. The combination of the individual in-circuit tests and test plan 106 forms a board test specification.

A device models library 108, physical database 110, and an electrical database 112 provide the data required for test generator 102 to generate the in-circuit tests. Electrical database 112 contains a list of the devices on the board, an electrical description for each device, and electrical interconnect information. Physical database 110 contains a topological description of the board which will be used by test controller 104 to locate and test DUT 116. Physical database 110 and electrical database 112 are typically generated by a CAD/CAM (Computer Aided Design/Computer Aided Manufacturing) system during design of a board.

Device models library 108 contains a plurality of pre-generated generic models for commonly used digital integrated circuit chips (IC's). Essentially, each model is a test routine which is to be inserted (i.e., edited) into the board test specification. Each device model provides, for a specific device, pin-out information (i.e., which pins are inputs, outputs, bi-directional, or unused), a test program, a method for pre-conditioning (described below) each output of the device, and device specific information including a test pattern rate and required signal levels.

Test controller 104 executes the in-circuit tests generated by test generator 102. A driver module 114 is used to apply the test signals to a DUT 116, and a sensor (receiver) module 118 is used to receive the response of DUT 116 to the test signals. The combination of driver module 114 and sensor module 118 is known as a tester channel.

The HP3070 tester is an example of an ATE system. The HP3070 is available from Hewlett-Packard Company, Palo Alto, Calif. Detailed operational information for the HP3070 is contained in "HP3070 Board Test System User's Documentation Set (1989)" available from Hewlett-Packard under HP part number 44930A.

While in-circuit test is based on testing each digital IC as if it were isolated from the surrounding devices, in reality, true electrical isolation cannot occur because of existing device interconnections. Consequently, the application of an input signal to a DUT is often in conflict with the quiescent state of that input by virtue of its coupling to an upstream output. An "upstream" device is a device whose output is driving an input of the DUT. Upstream output and upstream device are used interchangeably herein.

In order to provide the required input to the DUT, it may be necessary to back-drive or over-drive the output of the upstream device. That is, the upstream output must essentially be overwhelmed so that the tester controls the node between the input of the DUT and the output of the upstream device. This involves forcing a reverse current through the upstream output or sinking a current sourced by the upstream output in order to overcome its quiescent state.

Back-driving digital IC's can cause a plurality of test problems (for example, a tester may have insufficient drive capabilities to back-drive some devices; some digital devices have sensitive outputs which may be damaged by being back-driven; and attempts to back-drive an output of an integrated circuit which has feedback may result in a sustained oscillation). A more detailed discussion of in-circuit testing and associated back-drive problems can be found in U.S. Pat. No. 4,588,945 to Groves et al.

Known test methods deal with these problems by pre-conditioning (or simply "conditioning") devices upstream from a DUT. Each output which is to be back-driven may be conditioned. Conditioning involves placing the output to be back-driven in a state that can be easily/safely back-driven. The conditioned device/output will then be left in that state throughout the test. For example, the ASTTL device discussed above would have its output placed in a logical HIGH state (for TTL logic it is easier to pull a logical HIGH down to a logical LOW than it is to drive a LOW to a HIGH).

Figure 2:
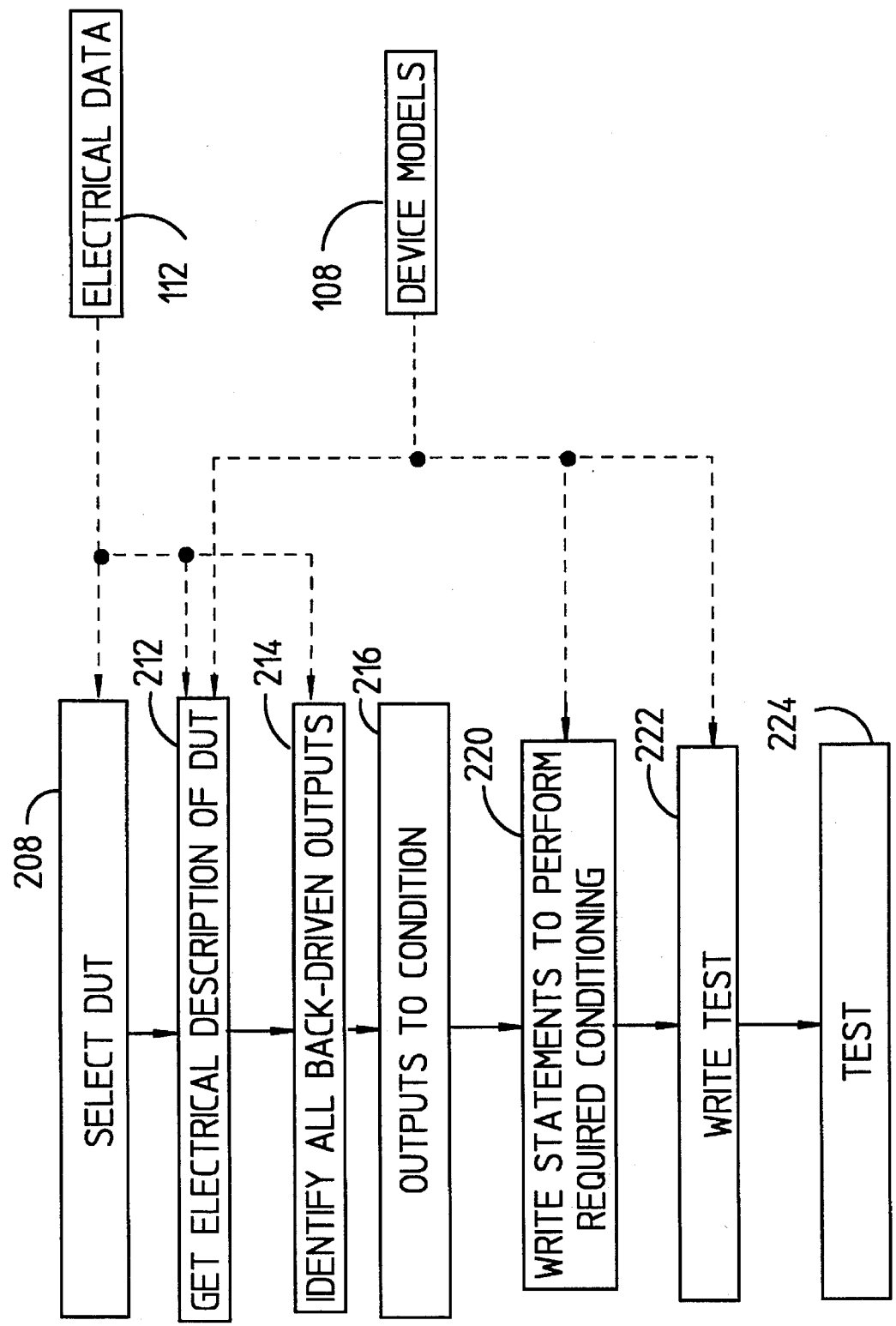
FIG. 2 is a flowchart illustrating the conventional method for generating an in-circuit test for a loaded printed circuit board.

The conventional method for generating (at test generator 102) an in-circuit ATE test (including conditioning) for a circuit board is shown in FIG. 2. The data required includes electrical database 112 and device models library 108. The method proceeds as follows. First, in a step 208, a device (DUT) is selected for test generation from electrical database 112. At step 212, the test generator gets an electrical description of the DUT from electrical database 112 and a test method for the DUT from device models library 108. The inputs of the DUT which will be driven during test are determined at this point. Then, at step 214, electrical interconnect data from electrical database 112 is used to identify all device outputs which will be back-driven in order to test the DUT. A list of these outputs to condition is created at step 216. A method for selecting which outputs to condition is described in commonly owned U.S. Pat. No. 5,144,229 to Johnsrud et al. The test statement required to condition the outputs is written at step 220. Finally, at step 222, the in-circuit ATE test 224 is written for the DUT. Writing the test involves retrieving a generic test (a test routine) for the DUT from device models library 108, and then merging the test routine with the conditioning test statements from step 220.

Figure 3:
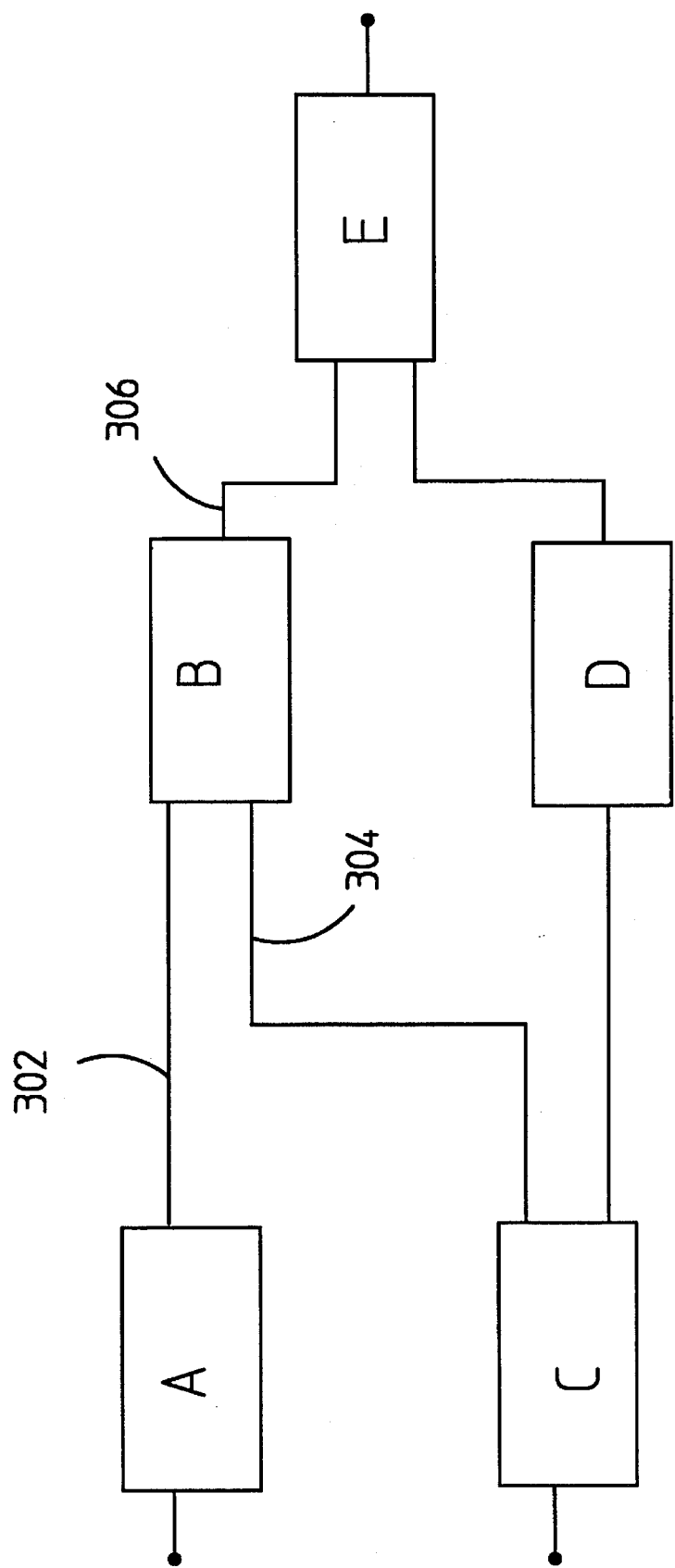
FIG. 3 is a simplified block diagram of a sample circuit used to illustrate operation of the method of the invention.

As discussed above, when devices which are not in device models library 108 are encountered, the conventional approach has been to manually create a model (if possible) or to skip the device and not test it. The present invention is a method for creating a test for a device when no model exists and when little or no information may available as to how to test the device. The invention takes advantage of the fact that in most electronic circuits, electronic devices are effected or influenced by upstream devices. This is illustrated in the example of FIG. 3. The sample circuit shown in FIG. 3 includes electronic devices A–E. Note that device B includes inputs 302,304 and an output 306. Input 302 is connected to an output of device A. Input 304 is connected to an output of device C. Thus, devices A and C effect or influence device B. In accordance with the invention, if no device model exists for device B, then the invention creates a test model based on the effect of devices A and C on device B. That is, while devices A and C are tested according to their test models, the effects of devices A and C on device B are captured and stored. The stimuli or patterns used to test devices A and C and the response of device B are then used as a test for device B.

For example, device A is tested using the device model from the library. After device A is successfully tested, the test stimuli for device A are repeated, and the effect of the test on device B (i.e., the output of device B) is captured and stored. Device C is then tested using the device model from the library for device C. After device C has been successfully tested, the stimuli used to test device C are used to re-run the test of device C. During this test, the effect on device B is captured and stored. The incidental stimuli created by the testing of devices A and C can then be used as a test for device B.

Normally, during the testing of devices A and C, other devices (which may potentially interfere with the testing of devices A or C) are disabled prior to testing devices A and C. For example, if devices A and C are connected to a bus or if a feedback loop is present, devices in the loop or on the bus are normally disabled as part of the testing of devices A and C. This will prevent the other devices from affecting the testing of devices A and C. Thus, the test for device A or device C may disable device B. Should this happen, device B must be enabled before its response to the testing of devices A and C can be observed. This can be accomplished in one of two ways. First, the tests for devices A and C can be modified to not disable device B. Second, a test statement may be added to the test to re-enable device B after it has been disabled.

The newly created test routine for device B will include the test stimuli for devices A and C with the expected result (output or response of device B) being the response of device B captured during the prior testing of devices A and C. This new test for device B may be re-run several times on several different circuit boards, while observing the output of device B. Once repeatability and effectiveness have been established, this test can be used as a test routine for device B (in its present circuit configuration with devices A and C). Any unrepeatable tests may be eliminated as being irrelevant. Similarly, if testing of one of devices A or C does not affect the output of device B, then the stimuli for testing that device may be eliminated from the test for device B.

The test generated/created according to the method of the invention is far from exhaustive and complete. Nonetheless, the invention provides a great deal of confidence that if the new test is applied and device B passes, then device B is probably the correct component, properly inserted, and all of the tested pins are functioning properly.

FIG. 4 illustrates the method of the invention for creating a test for a DUT. In a step 402, the tester determines whether a device model is present in device models library 108. If a device model is present, then the device model is retrieved from the library in step 404 and a test routine is extracted from the device model at step 406. The test for the DUT is then written at step 408.

If, however, it is determined at step 402 that a device model for the DUT is not present in device models library 108, then the method creates a test routine for the DUT in steps 410–416. At step 410, it is determined which devices have an output driving an input of the DUT. At step 411, it is determined whether the DUT is disabled by a test routine for any of the driving devices. If the DUT is disabled by a test routine for a driving device, then the DUT is enabled at step 412. If the DUT is not disabled, each driving device is tested at step 413.

During testing of each driving device, the response of the DUT is observed or captured at step 414. Step 414 can be performed simultaneously with step 413 as illustrated in FIG. 4. That is, as the driving devices are tested, the response of the DUT may be captured. If the driving devices test successfully, then test creation is complete. Alternatively, as described in the example set forth above, each driving device may be tested for proper operation. If tests for the driving devices are successful, then they are repeated and the response of the DUT captured. This testing method, however, requires additional test time.

At step 416, the test stimuli for the driving devices and the observed responses of the DUT are used as an in-circuit test for the DUT. The in-circuit test for the DUT is then written at step 408. As discussed above with reference to step 222 of FIG. 2, writing a test involves merging a test routine with any required conditioning test statements and incorporating combined test routine and conditioning test statements into the board test specification.

For ease of discussion, the steps of conditioning back-driven outputs are omitted from the flowchart of FIG. 4. Any required conditioning may be performed, for example, by adding steps 214–220 of FIG. 2 before step 408.

The method of the present invention is particular suited for generating in-circuit tests for devices in microprocessor-based circuits. Test routines are normally available for the microprocessors themselves. However, test routines are often not available for other devices, such as ASICs (application specific integrated circuits), which may be employed in the microprocessor circuits. The invention relies on the testing of the microprocessor to generate the test patterns for the other devices.

While the invention has been particularly shown and described with reference to several preferred embodiments thereof, it will be understood by those skilled in the art that various changes in form and details may be made therein without departing from the spirit and scope of the invention as defined in the appended claims.

What is claimed is:

1. In an automated test equipment system for testing a circuit board containing a plurality of interconnected digital devices, a method for generating an in-circuit test for a device under test, the method comprising the steps of:

(a) determining, from electrical interconnect data for the devices on the circuit board, each device that has an output driving an input of the device under test;

(b) conducting an in-circuit test for each of said driving devices using test stimuli;

(c) observing a first response of said device under test during said in-circuit test of said driving devices; and (d) using said test stimuli used for said driving devices and said first observed response of said device under test as an in-circuit test for said device under test.

2. The method of claim 1, wherein said in-circuit test of said step (b) comprises the steps of:

(1) applying said test stimuli to inputs of each driving device;

(2) observing outputs of each driving device; and (3) comparing, for each driving device, said observed outputs of said driving device to expected outputs.

3. The method of claim 1, wherein said step (d) of using comprises the steps:

(1) applying said test stimuli to inputs of each driving device;

(2) observing a second response of said device under test; and (3) comparing said second observed response of said device under test from step (2) to said first observed response of said device under test from step (c).

4. A method for generating an in-circuit test for a plurality of digital devices on a printed circuit board using an automated test equipment system, the method comprising the steps of:

(a) retrieving a test routine from a device models library for as many digital devices on the printed circuit board as possible; and (b) for a remaining device on the circuit board for which no test model is present in said device models library (1) determining from electrical interconnect data for the devices on the circuit board each device that has an output driving an input of said remaining device, (2) conducting an in-circuit test for each of said driving devices using test stimuli;

(3) observing a first response of said remaining device during said in-circuit test of said driving devices, and (4) using said test stimuli used for said drying devices and said first observed response of said remaining device as an in-circuit test for said remaining device.

5. The method of claim 4, wherein said in-circuit test of said step (b)(2) comprises the steps of:

i) applying said test stimuli to inputs of each driving device;

ii) observing outputs of each drying device; and iii) comparing, for each driving device, said observed outputs of said driving device to expected outputs.

6. The method of claim 4, wherein said step (b)(4) of using comprises the steps of:

i) applying said test stimuli to inputs of each driving device;

ii) observing a second response of said remaining device; and iii) comparing said second observed response of said remaining device from step (ii) to said first observed response of said remaining device from step (b)(3).

* * * * *

UNITED STATES PATENT AND TRADEMARK OFFICE
CERTIFICATE OF CORRECTION

PATENT NO. : 5,590,136
DATED : 12/31/96
INVENTOR(S) : Kamran Firooz

It is certified that error appears in the above-indentified patent and that said Letters Patent is hereby corrected as shown below:

Column 7, Claim 4, line 3, Delete "*drying*" and insert therefor
-- *driving* --.

Column 7, Claim 5, line 11: Delete "*drying*" and insert therefor
-- *driving* --.

Signed and Sealed this

Twelfth Day of October, 1999

Q. TODD DICKINSON

Attest:

*Attesting Officer*     Acting Commissioner of Patents and Trademarks